(12) United States Patent
Numata et al.

(10) Patent No.: US 7,796,660 B2
(45) Date of Patent: Sep. 14, 2010

(54) THREE-DIMENSIONAL PHOTONIC CRYSTAL LIGHT EMITTING DEVICE

(75) Inventors: Aihiko Numata, Inagi (JP); Kazuya Nobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 50 days.

(21) Appl. No.: 12/366,888

(22) Filed: Feb. 6, 2009

(65) Prior Publication Data

US 2009/0201960 A1 Aug. 13, 2009

(30) Foreign Application Priority Data

Feb. 7, 2008 (JP) ............................. 2008-027872

(51) Int. Cl.
*H01S 3/14* (2006.01)
(52) U.S. Cl. ........................................ 372/39; 385/131
(58) Field of Classification Search ............ 372/45.011, 372/96, 50.124, 99; 385/131
See application file for complete search history.

(56) References Cited

U.S. PATENT DOCUMENTS

| | | | |
|---|---|---|---|
| 5,335,240 A * | 8/1994 | Ho et al. | 372/39 |
| 7,085,467 B2 * | 8/2006 | Ikemoto et al. | 385/129 |
| 7,308,181 B2 * | 12/2007 | Nobayashi et al. | 385/131 |
| 7,502,541 B2 * | 3/2009 | Takagi et al. | 385/129 |
| 2002/0126721 A1 | 9/2002 | Kito et al. | 372/45 |
| 2003/0116767 A1 | 6/2003 | Kneissl et al. | 257/79 |
| 2005/0196118 A1 | 9/2005 | Ikemoto et al. | 385/129 |

FOREIGN PATENT DOCUMENTS

| | | |
|---|---|---|
| JP | 2001-257425 A | 9/2001 |
| JP | 2003-198045 A | 7/2003 |
| JP | 2005-292787 A | 10/2005 |

OTHER PUBLICATIONS

E. Yablonovitch, "Inhibited Spontaneous Emission in Solid-State Physics and Electronics," Physical Review Letters, vol. 58, No. 20, May 18, 1987, pp. 2059-2062.

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto

(57) ABSTRACT

The three-dimensional photonic crystal light emitting device includes a three-dimensional photonic crystal, and a defect forming a resonator in the three-dimensional photonic crystal. In the three-dimensional photonic crystal, an N-cladding layer formed of an N-type semiconductor, an active layer disposed inside the resonator, a P-cladding layer formed of a P-type semiconductor, a tunnel junction layer, and a first N-conductive layer formed of a first N-type conductor are arranged in this order. Electric conductivity of the first N-type conductor is higher than that of the P-type semiconductor. The light emitting device achieves high carrier injection efficiency and a high optical confinement effect.

8 Claims, 14 Drawing Sheets

PRIOR ART

| LATTICE CONSTANT | a |
|---|---|
| PERIODIC NUMBER IN x and y DIRECTIONS | 13 × 13 |
| PERIODIC NUMBER IN z DIRECTION | 7 |
| REFRACTIVE INDEX | 2.4 |
| RW | 0.32a |
| RH | 0.24a |
| JW | 0.54a |
| JH | 0.10a |
| Dx | 1.20a |
| Dy | 1.20a |
| Dz | 0.24a |

| ONE SIDE OF DISCRETE STRUCTURE | Q-FACTOR |
|---|---|
| 0.54a(=JW) | 4100 |
| 0.64a | 3800 |
| 0.76a | 3100 |

THREE-DIMENSIONAL PHOTONIC CRYSTAL LIGHT EMITTING DEVICE

BACKGROUND OF THE INVENTION

The present invention relates to a three-dimensional photonic crystal light emitting device such as a light-emitting diode (LED) or a laser diode (LD), which includes a three-dimensional photonic crystal and emits light by injecting an electric current into an active medium.

A general conventional semiconductor light emitting device is constituted of a P-cladding layer, an active layer and an N-cladding layer. The semiconductor light emitting device is injected with holes from an electrode through the P-cladding layer to the active layer. On the other hand, the semiconductor light emitting device is injected with electrons from an electrode through the N-cladding layer to the active layer. The holes and the electrons recombine together in the active layer to emit spontaneous emitted light having energy corresponding to a band gap of the active layer. In particular, when a resonator is formed with a cleaved surface so as to include an active layer, the semiconductor light emitting device generates stimulated emitted light due to a light-amplification by the resonator to generate a laser beam.

As a technique to increase luminous efficiency of an LD, a technique to increase carrier injection efficiency by lowering electric resistance, a technique to reduce a loss in a recombination process other than that in stimulated emitted light, and a technique to decrease leakage light by enhancing optical confinement are proposed.

Japanese Patent Laid-Open No. 2003-198045 discloses a configuration of an LD in which part of a P-cladding layer is replaced with an N-type material, and a tunnel junction layer is disposed between the P-type material and the N-type material to lower electric resistance. However, this configuration is incapable of enhancing the optical confinement, and incapable of reducing a loss in the recombination process.

On the other hand, there has been proposed, as a method of reducing a loss due to recombination which brings emission of light other than light at a desired wavelength, a method of controlling spontaneous emission by a photonic crystal to obtain high luminous efficiency (refer to "Physical Review Letters, Vol. 58, pp. 2059, 1987"). The photonic crystal is a configuration (structure) forming a permittivity distribution with a period smaller than a wavelength. The method disclosed in the "Physical Review Letters, Vol. 58, pp. 2059, 1987" is to limit a wavelength band of light capable of existing in the vicinity of the active layer by using a property that is a "photonic band gap" which the photonic crystal has, to suppress spontaneous emitted light other than the light at a desired wavelength. In this way, it is desirable to use a three-dimensional photonic crystal forming a three-dimensional permittivity distribution in order to control the spontaneous emission to obtain high luminous efficiency. Further, from the standpoint of an optical confinement effect, it is preferable to use a three-dimensional photonic crystal having a strong optical confinement effect.

Japanese Patent Laid-Open No. 2001-257425 discloses a light emitting device using such a three-dimensional photonic crystal. In the configuration disclosed in Japanese Patent Laid-Open No. 2001-257425, an active layer is formed in the three-dimensional photonic crystal, and carriers are injected into the photonic crystal through a contact layer from a metal electrode provided outside the photonic crystal. The injected carriers are conducted in the configuration of the photonic crystal to be connected to a carrier conducting path formed of a line defect to be guided to an active portion. Moreover, U.S. Pat. No. 5,335,240 and Japanese Patent Laid-Open No. 2005-292787 disclose examples of configurations of the three-dimensional photonic crystal.

In the configuration disclosed in Japanese Patent Laid-Open No. 2001-257425, the carriers injected from the electrode are conducted in the configuration of the photonic crystal. In the configuration disclosed in Japanese Patent Laid-Open No. 2001-257425, since the carriers are conducted inside columnar structures arranged in a hanging rack form, a cross-sectional area of the carrier conducting path is smaller and a length thereof is longer than those in a conventional semiconductor light emitting device. Therefore, a series resistance in the carrier conducting path is increased. This brings about lowering of injection efficiency. This has a significant effect on the P-cladding layer with a lower electric conductivity particularly.

Further, in order to increase the injection efficiency in the light emitting device using the three-dimensional photonic crystal, it is necessary to reduce a thickness of the P-cladding layer. However, reducing the thickness of the P-cladding layer decreases a periodic number of the photonic crystal, which weakens the optical confinement effect.

BRIEF SUMMARY OF THE INVENTION

The present invention provides a three-dimensional photonic crystal light emitting device which is configured to achieve both high carrier injection efficiency and a high optical confinement effect.

The present invention provides as one aspect thereof a three-dimensional photonic crystal light emitting device including a three-dimensional photonic crystal, and a defect forming a resonator in the three-dimensional photonic crystal. In the three-dimensional photonic crystal, an N-cladding layer formed of an N-type semiconductor, an active layer disposed inside the resonator, a P-cladding layer formed of a P-type semiconductor, a tunnel junction layer, and a first N-conductive layer formed of a first N-type conductor are arranged in this order. Electric conductivity of the first N-type conductor is higher than that of the P-type semiconductor.

Other aspects of the present invention will become apparent from the following description and the attached drawings.

DETAILED DESCRIPTION OF THE EMBODIMENTS

Exemplary embodiments of the present invention will hereinafter be described with reference to the accompanying drawings.

Embodiment 1

Figure 1:
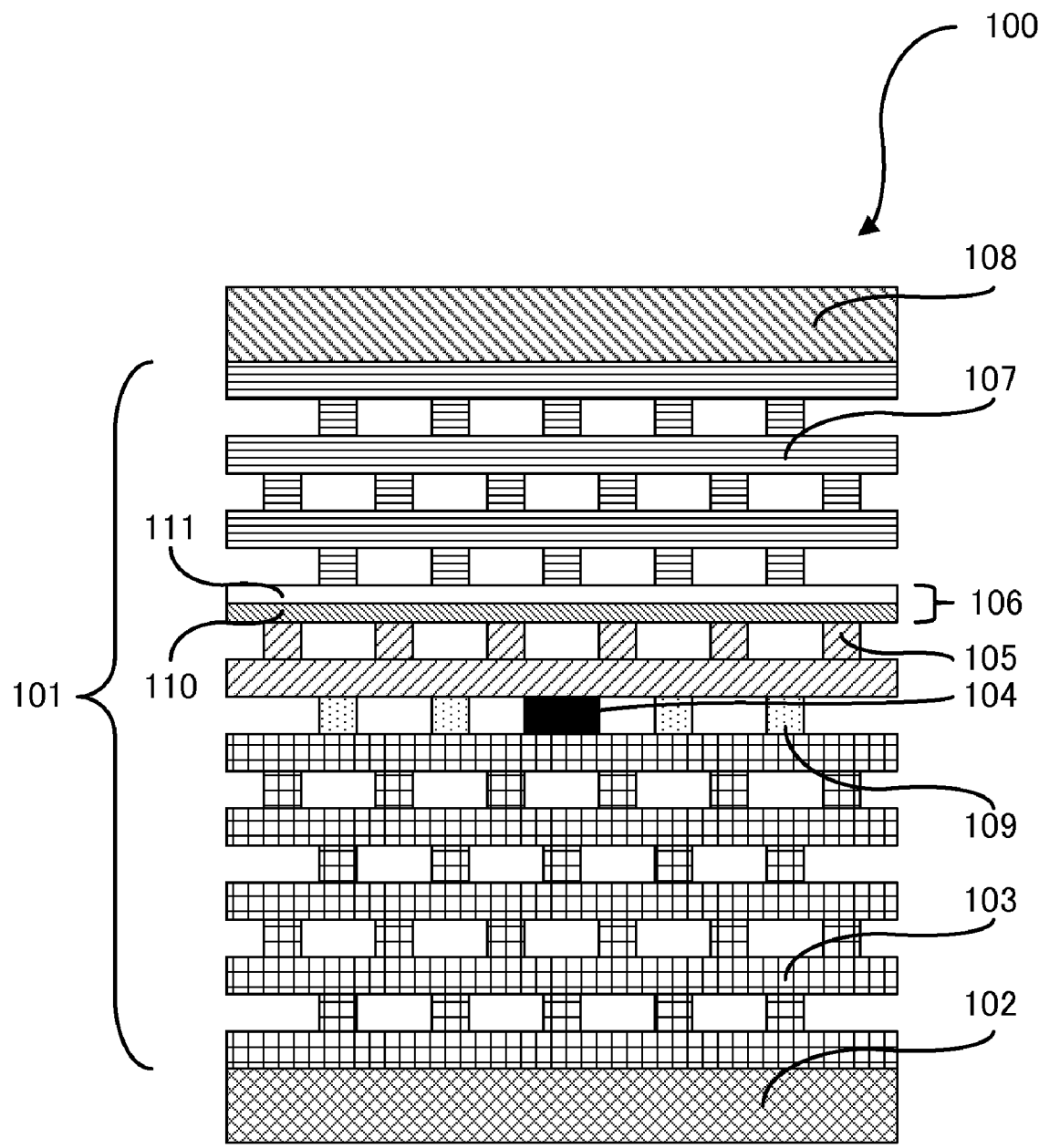
FIG. 1 is a cross-sectional view showing the configuration of a three-dimensional photonic crystal light emitting device that is a first embodiment (Embodiment 1) of the present invention.

FIG. 1 shows a cross section of a three-dimensional photonic crystal light emitting device that is Embodiment 1 of the present invention.

A light emitting device 100 includes a three-dimensional photonic crystal 101, an N-type electrode 102, an N-cladding layer 103 formed of an N-type semiconductor, an active layer 104, and a P-cladding layer 105 formed of a P-type semiconductor. The light emitting device 100 further includes a tunnel junction layer 106, an N-conductive layer (first N-conductive layer) 107, an N-type electrode 108, and an insulating part 109. The three-dimensional photonic crystal 101 is configured such that the layers from the N-cladding layer 103 to the N-conductive layer 107 are arranged in this order (in order of reference numerals) so as to be mutually adjacent.

Figure 8:
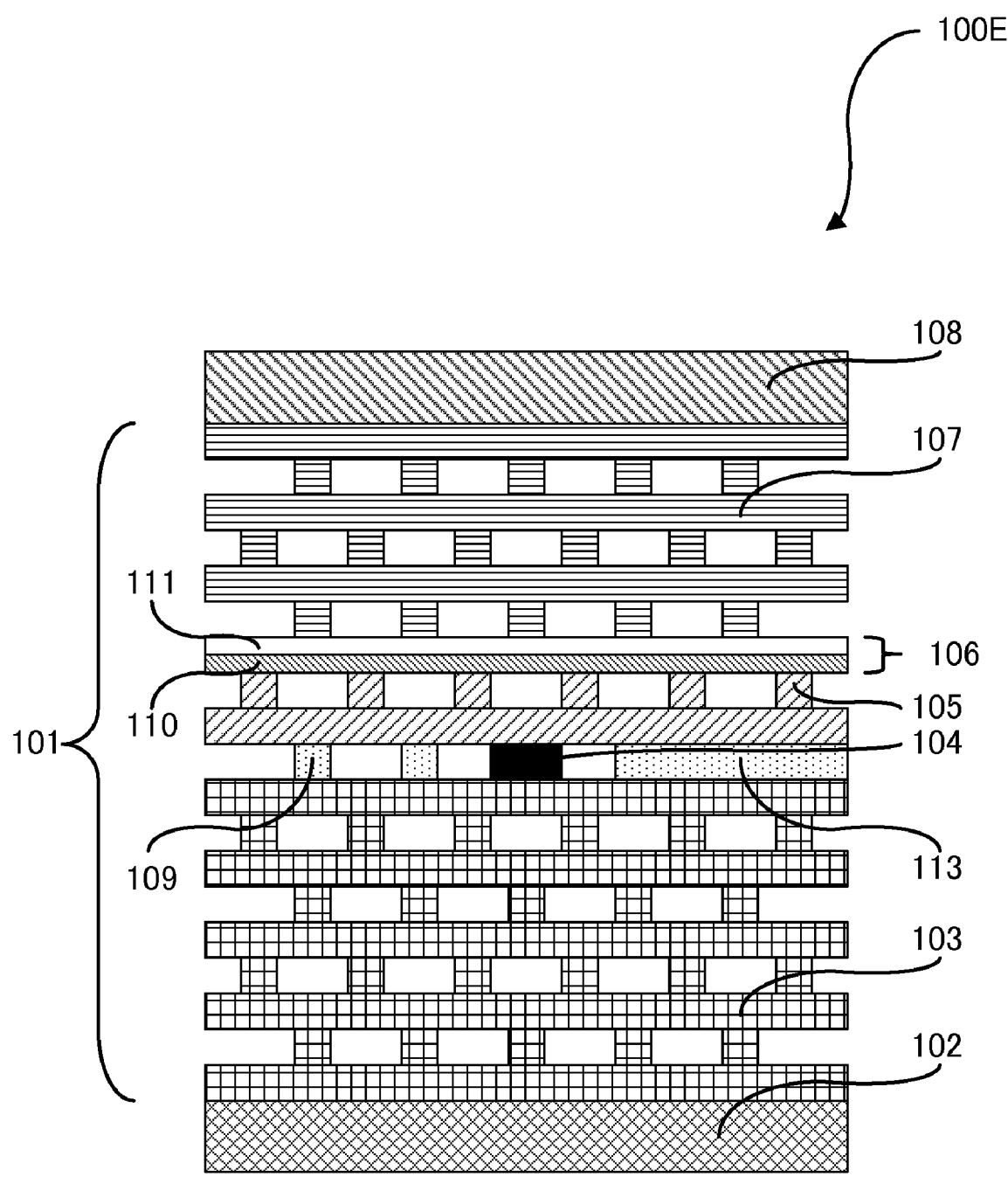
FIG. 8 is a cross-sectional view showing the configuration of a three-dimensional photonic crystal light emitting device that is a fifth modified example (Modified Example 5) of Embodiment 1.

The three-dimensional photonic crystal 101 has therein a resonator serving as a point defect formed of an active medium. The resonator internally has the active layer 104. The resonator amplifies thereinside light emitted from the active layer 104, and the amplified light is extracted to the outside through a line defect waveguide 113 or the like as shown in FIG. 8.

Of the tunnel junction layer 106, a portion 110 contacting the P-cladding layer 105 is formed of a P-type semiconductor which is more highly doped than the P-cladding layer 105, and a portion 111 contacting the N-conductive layer 107 is formed of an N-type conductor which is more highly doped than the N-conductive layer 107. It is recommended that the N-type conductor be formed of metal oxide which is doped with a specific dopant. The configuration of the three-dimensional photonic crystal in the present embodiment is basically the same as that disclosed in U.S. Pat. No. 5,335,240.

In a light emitting device using a three-dimensional photonic crystal having such a configuration, a cross-sectional area and a length of a carrier conducting path are small and long. A resistance factor in the carrier conducting path is proportional to its length, and inversely proportional to its cross-sectional area. Therefore, in a light emitting device 800 having a configuration in which a cladding layer of the LD disclosed in Japanese Patent Laid-Open No. 2003-198045 is merely replaced with a photonic crystal as shown in FIG. 2, carrier injection efficiency is extremely low.

Figure 2:
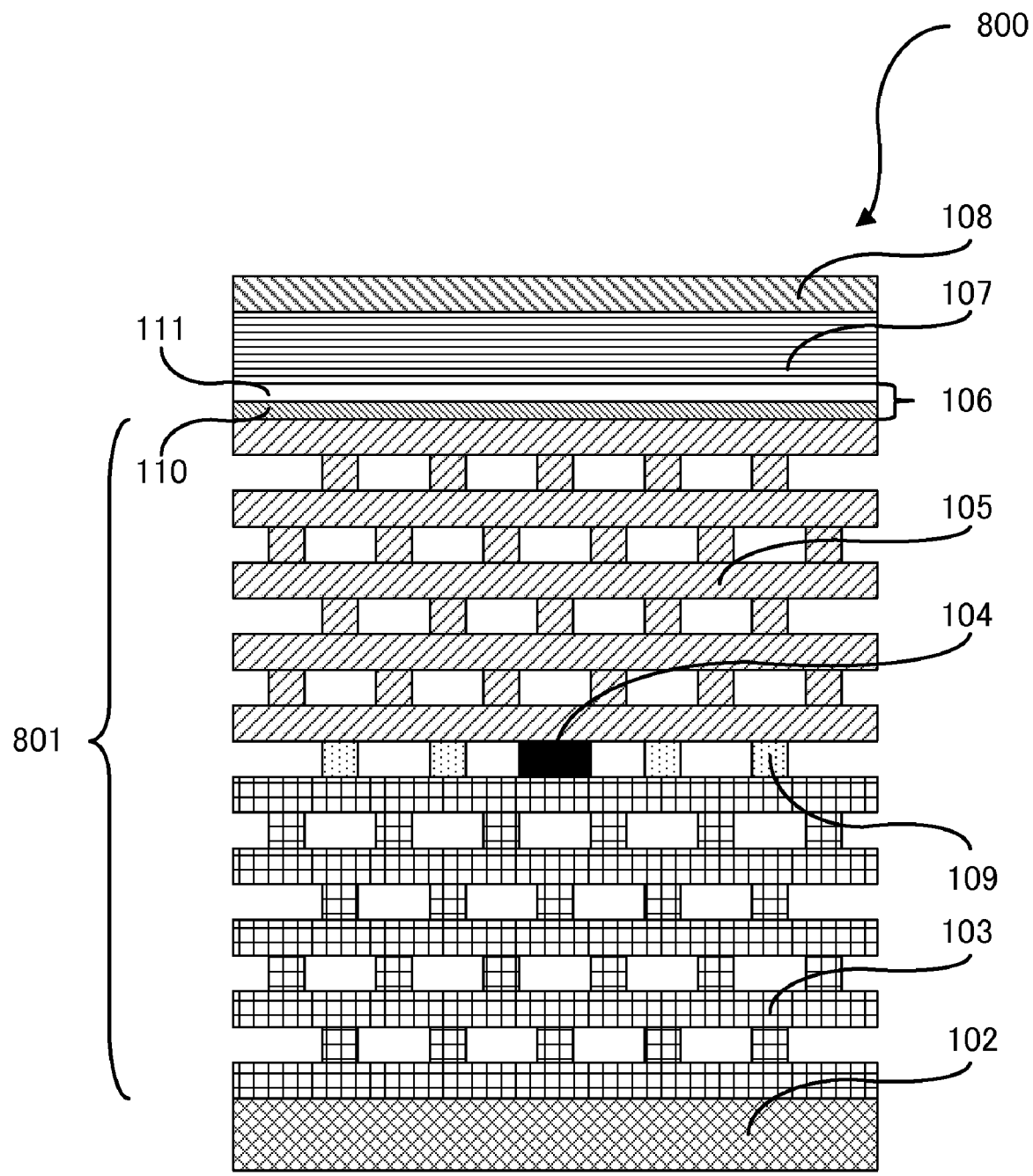
FIG. 2 is a cross-sectional view showing the configuration of a light emitting device in which a cladding layer of the LD disclosed in Japanese Patent Laid-Open No. 2003-198045 is merely replaced with a photonic crystal.

Component parts serving similarly to those in FIG. 1 in the light emitting device 800 shown in FIG. 2 are denoted by the same reference numerals in FIG. 1. The configuration in FIG. 2 is different from that shown in FIG. 1 in the point that the tunnel junction layer 106 and the N-conductive layer 107 are arranged outside the photonic crystal 801.

In normal semiconductors, an effective mass of a valence band is greater than that of a conduction band. Therefore, carrier mobility in a P-type semiconductor is lower than that in an N-type semiconductor, which results in a low electric conductivity. Accordingly, Joule heat generated in the P-cladding layer is a principal factor to determine the injection efficiency. For example, in a case of GaN, electric conductivity of an N-type semiconductor doped with Si is approximately 1e3 to 1e4 (S/m), and electric conductivity of a P-type semiconductor doped with Mg is approximately 1e1 to 1e2 (S/m). That is, the electric conductivity in the P-type semiconductor is approximately one-tenth to one-thousandth of that of the N-type semiconductor.

Therefore, in order to reduce a loss due to the Joule heat in the light emitting device using the three-dimensional photonic crystal, it is necessary to reduce a thickness of the P-cladding layer. However, reducing the thickness of the P-cladding layer decreases a periodic number of the photonic crystal, which weakens an optical confinement effect.

Figure 3:
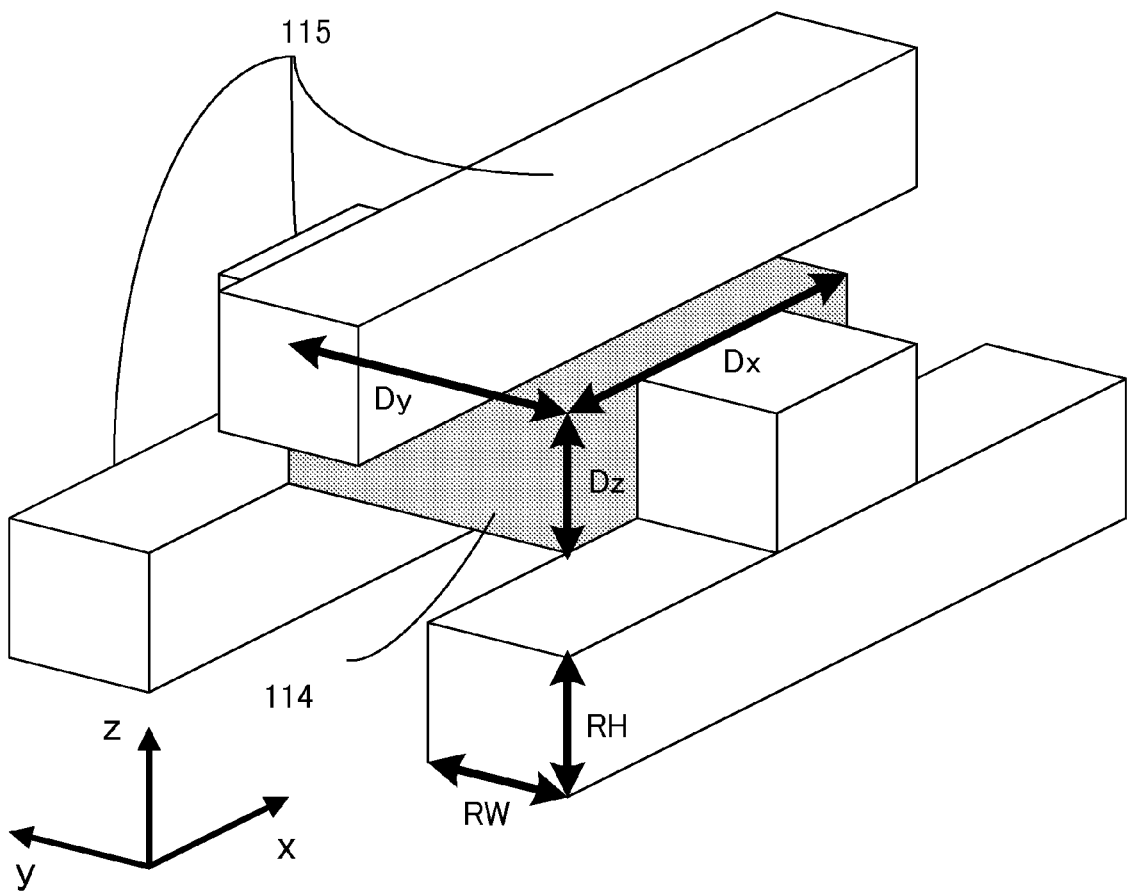
FIG. 3 is an enlarged view showing the vicinity of a point defect resonator in the three-dimensional photonic crystal light emitting device of Embodiment 1 and U.S. Pat. No. 5,335,240.

FIG. 3 is an enlarged view of the vicinity of a point defect resonator 114 in the three-dimensional photonic crystal in the present embodiment and U.S. Pat. No. 5,335,240. FIG. 3 takes an x-axis and a y-axis in directions parallel to the respective layers (in-plane directions of the respective layers), and takes a z-axis in a stacking direction of the layers. The three-dimensional photonic crystal has a configuration in which columnar structures 115 extending in directions orthogonal to each other are stacked in a hanging rack form as shown in FIG. 3.

In the three-dimensional photonic crystal shown in FIG. 3, when a lattice constant is defined as a, a width RW and a height RH of the columnar structure are both 0.35 a.

The point defect resonator 114 has a rectangular shape (rectangular parallelepiped shape) as shown in FIG. 3, and its lengths Dx, Dy and Dz in the directions of the x-axis, y-axis and z-axis are respectively 0.95 a, 0.95 a and 0.35 a.

The inventors calculated Q-factor under a condition in which a laser emission wavelength of the light emitting device (laser element) using the photonic crystal shown in FIG. 3 was approximately 500 nm and a structural refractive index was 2.4. Outside the cladding layer, a conductor is disposed in which a real part of its refractive index is 2.4, an imaginary part thereof is 0.04, and its thickness is 2 a. Further, the inventors calculated the Q-factor under a condition in which a periodic number of the columnar structures in an x-y plane is 20×20 while varying a stacked layer number of the cladding layer. The Q-factor is a coefficient denoting strength of the optical confinement effect of the resonator, and increase of the Q-factor increases the optical confinement effect.

When the stacked layer number of the cladding layers was 32 in one side, which was sufficient, under the above-described conditions, the Q-factor was 380,000. However, when the stacked layer number of the cladding layer was 8 in one side, the Q-factor was 660 and the optical confinement effect was too low to generate laser oscillation.

On the other hand, in a case in which the stacked layer number of the N-cladding layer was 32, the stacked layer number of the P-cladding layer was 8, and a photonic crystal was formed by 24-layer conductors on the outside of the P-cladding layer, the Q-factor was 40,000, which provided a sufficient optical confinement effect.

Then, in the three-dimensional photonic crystal shown in FIG. 1, replacing part of the P-cladding layer 105 shown in FIG. 2 with the N-conductive layer 107 formed of the N-type conductor (first N-type conductor) having electric conductivity higher than that of the P-type semiconductor can reduce generation of the Joule heat.

In accordance with the above description, the three-dimensional photonic crystal light emitting device 100 in the present embodiment shown in FIG. 1 is capable of achieving both high carrier injection efficiency and a high optical confinement effect.

In order to obtain a more sufficient optical confinement effect, it is preferable that the three-dimensional photonic crystal be formed by stacking layers of 6 or more periods in one side. That is, it is preferable that, in the light emitting device 100 shown in FIG. 1, the total stacked layer number of the P-cladding layer 105, the tunnel junction layer 106 and the N-conductive layer 107 be 6 or more periods, and the stacked layer number of the N-cladding layer 103 be 6 or more periods.

Further, in order to suppress generation of the Joule hear in the P-cladding layer 105, it is preferable that the thickness of the P-cladding layer 105 be thinner than that of the N-conductive layer 107, and moreover, it is preferable that the stacked layer number of the P-cladding layer 105 be one period or less.

Hereinafter, light emitting devices 100A to 100E as modified examples of Embodiment 1 will be described. In the modified examples, component parts which are the same as those in FIG. 1 are denoted by the same reference numerals in FIG. 1 (however, the three-dimensional photonic crystal is denoted by reference numeral 101 even though having a different configuration).

MODIFIED EXAMPLE 1

The light emitting device 100A shown in FIG. 4 achieves a sufficient optical confinement effect by further stacking a three-dimensional photonic crystal (hereinafter the three-dimensional photonic crystal is referred to as a dielectric layer 112) onto an outer circumferential portion of the N-conductive layer 107. That is, the light emitting device 100A has the dielectric layer 112 on an opposite side of the tunnel junction layer 106 with respect to the N-conductive layer 107.

The light emitting device 100A is capable of obtaining a sufficient optical confinement effect if the total stacked layer number of the P-cladding layer 105, the tunnel junction layer 106, the N-conductive layer 107 and the dielectric layer 112 is 6 or more periods. Disposing the dielectric layer 112 decreases the thickness of the P-cladding layer 105, which enables reduction of generation of the Joule heat.

Figure 4:
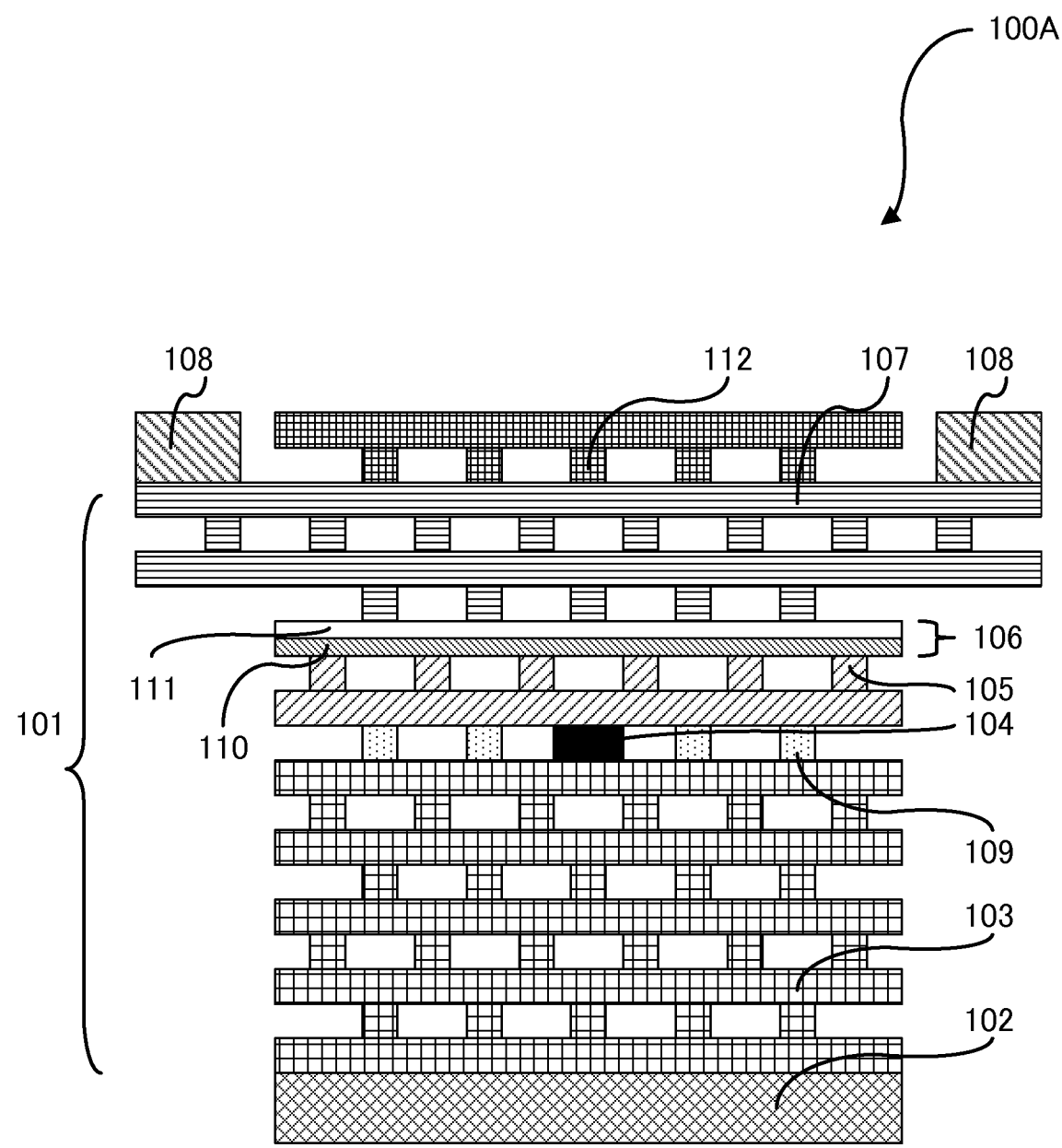
FIG. 4 is a cross-sectional view showing the configuration of a three-dimensional photonic crystal light emitting device that is a first modified example (Modified Example 1) of Embodiment 1.

The light emitting device 100A shown in FIG. 4 has the N-type electrode 108 at the outside in the in-plane direction of the N-conductive layer 107, and carriers are injected therethrough.

Further, the highly-doped P-type semiconductor layer 110 and the highly-doped N-type conductor layer 111 are arranged in the tunnel junction layer 106 disposed at an interface between the P-type semiconductor and the N-type conductor. Therefore, an electric current is injected from the N-conductive layer 107 into the P-cladding layer 105 due to a tunnel effect.

It is preferable that the N-type semiconductor, the P-type semiconductor and the N-type conductor be formed of materials having a band gap broader than a laser oscillation frequency in order to prevent absorption of a laser beam. Moreover, it is more preferable that an electron affinity of the N-type conductor (first N-type conductor) be larger than that of the P-type semiconductor because a height of a tunnel barrier is lowered. As a combination of such materials, for example, in a light emitting device with an oscillation wavelength of 500 nm, the following selections are preferable.

The P-type semiconductor is preferably selected from Mg-doped GaN, AlGaN and InGaN with a ratio of In of 0.2 or less. Further, the N-type semiconductor is preferably selected from Si-doped GaN, AlGaN, and InGaN with a ratio of In of 0.2 or less. Moreover, the N-type conductor is preferably selected from Nb-doped $TiO_2$ and Al-doped ZnO. An electron affinity of GaN is approximately 3.4 (eV), an electron affinity of $TiO_2$ is approximately 4.2 (eV), and an electron affinity of ZnO is approximately 4.4 (eV). The electric conductivities of Nb-doped $TiO_2$ and Al-doped ZnO are both approximately 1e5 (S/m).

Further, in a light emitting device with an oscillation wavelength of 900 nm, the P-type semiconductor is preferably Zn-doped GaAs, the N-type semiconductor is preferably Si-doped GaAs, and the N-type conductor is preferably selected from $TiO_2$ and ZnO. An electron affinity of GaAs is approximately 4.0 (eV). Moreover, the dielectric layer 112 is preferably formed of a dielectric having a permittivity (dielectric constant) which is the same as those of the N-type semiconductor and the P-type semiconductor. For example, the dielectric layer 112 may be formed using a material which is the same as those of the N-type semiconductor and the P-type semiconductor and is a non-doped semiconductor.

MODIFIED EXAMPLE 2

Figure 5:
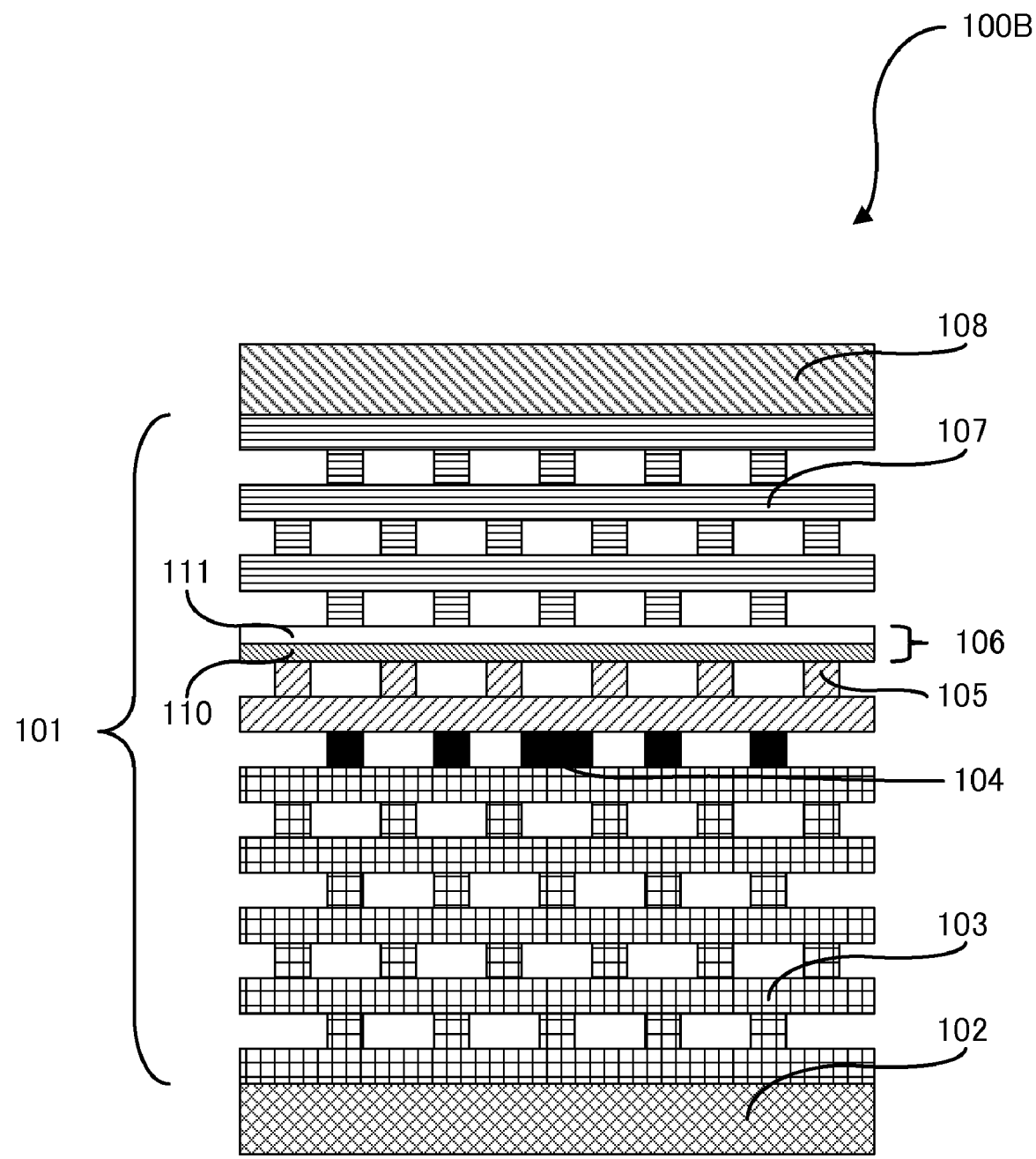
FIG. 5 is a cross-sectional view showing the configuration of a three-dimensional photonic crystal light emitting device that is a second modified example (Modified Example 2) of Embodiment 1.

The light emitting device 100 shown in FIG. 1 has the active layer 104 only in the point defect, and has the insulating part 109 disposed at a portion other than the point defect between the P-cladding layer 105 and the N-cladding layer 103. However, as in the light emitting device 100B shown in FIG. 5, the portion other than the point defect may be formed as the active layer 104.

MODIFIED EXAMPLE 3

Figure 6:
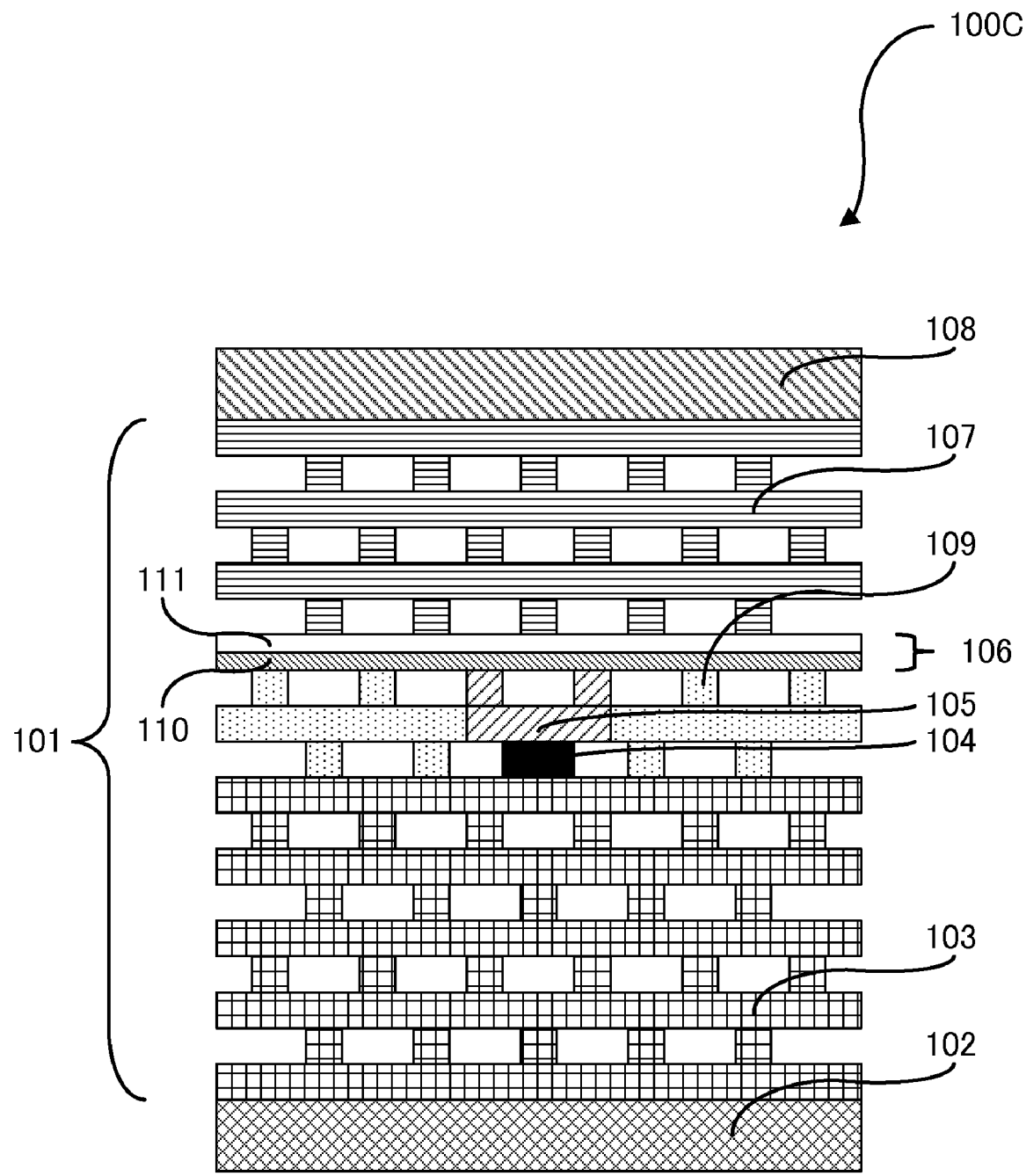
FIG. 6 is a cross-sectional view showing the configuration of a three-dimensional photonic crystal light emitting device that is a third modified example (Modified Example 3) of Embodiment 1.

As in the light emitting device 100C shown in FIG. 6, the insulating part 109 may be provided in the P-cladding layer 105 to form a current confining region. Since the carrier mobility of the P-type semiconductor is lower than that of the N-type semiconductor, it is more effective that the current confining region is formed in the P-cladding layer 105.

MODIFIED EXAMPLE 4

Figure 7:
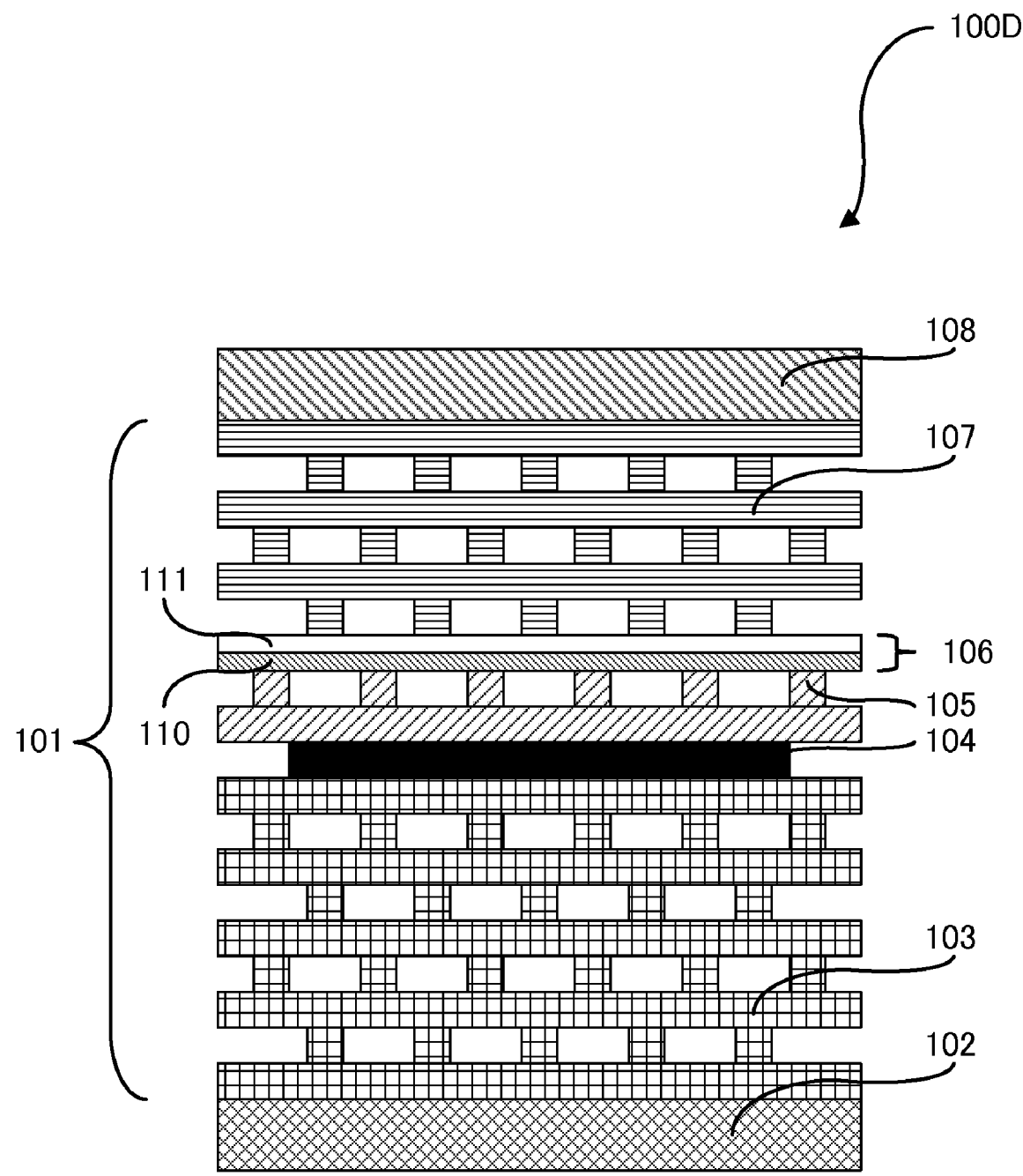
FIG. 7 is a cross-sectional view showing the configuration of a three-dimensional photonic crystal light emitting device that is a fourth modified example (Modified Example 4) of Embodiment 1.

In the light emitting device 100 shown in FIG. 1, the active layer 104 is formed in the point defect. However, the active layer 104 is not necessarily to be formed in the point defect, but may be formed in a line defect as in the light emitting device 100D shown in FIG. 7.

MODIFIED EXAMPLE 5

In the description of the light emitting device 100 shown in FIG. 1, the case where resonance generates stimulated emission to perform laser oscillation in the light emitting device (laser element) 100 was explained. However, the light emitting device 100 is not necessarily to be used as a laser device. For example, the light emitting device 100 may be used as a high-efficiency resonator-type LED with a narrow wavelength range. In this case, as in the light emitting device 100E shown in FIG. 8, light generated by the resonator (active layer 104) can be extracted to the outside through the line defect waveguide 113.

The configuration in which the light generated by the resonator (active layer 104) is extracted to the outside through the line defect waveguide 113 can be applied to a laser device as well in the same way.

Embodiment 2

Figure 9:
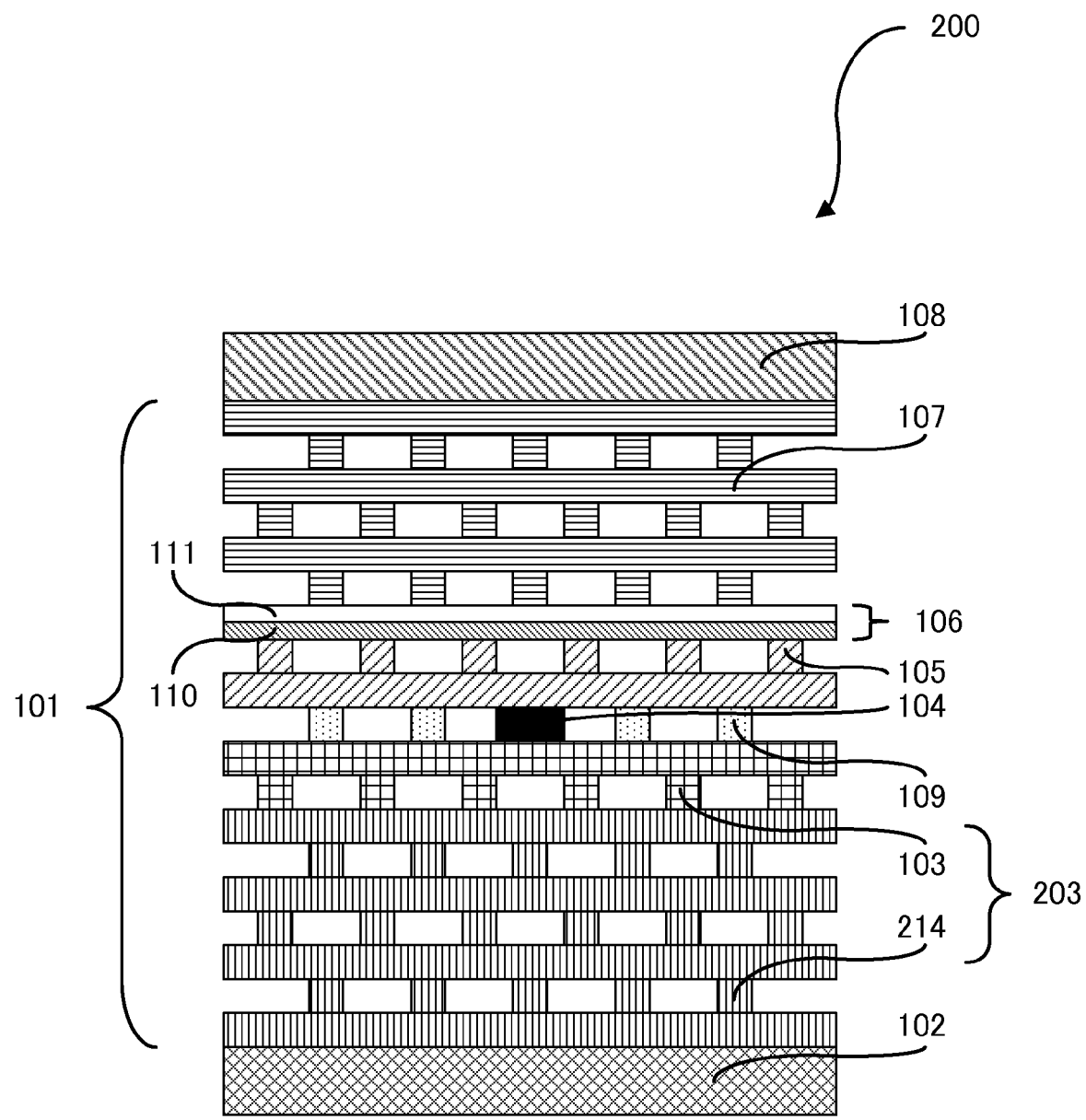
FIG. 9 is a cross-sectional view showing the configuration of a three-dimensional photonic crystal light emitting device that is a second embodiment (Embodiment 2) of the present invention.

FIG. 9 shows a cross section of a three-dimensional photonic crystal that is Embodiment 2 of the present invention. Component parts which are the same as those in FIG. 1 are denoted by the same reference numerals in FIG. 1 (however, the three-dimensional photonic crystal is denoted by reference numeral 101 even though having a different configuration).

In a light emitting device 200 in the present embodiment, a portion of an N-cladding layer 203 contacting the N-type electrode 102 has an N-conductive layer (second N-conductive layer) 214 formed of an N-type conductor (second conductor) whose electric conductivity is higher than that of an N-type semiconductor. That is, the light emitting device 200 has, in the N-cladding layer 203, the N-conductive layer 214 formed of the N-type conductor whose electric conductivity is higher than that of the N-type semiconductor on an opposite side of the active layer 104 with respect to the N-cladding layer 103.

As in the present embodiment, replacing part of the N-cladding layer 203 with a material having a high electric conductivity reduces generation of the Joule heat in the N-cladding layer 203.

The material of the N-conductive layer 214 may be different from that of the N-conductive layer 107. However, using a same material for the N-conductive layer 214 as that of the N-conductive layer 107 allows processes for forming periodic patterns of the photonic crystal to be in common, which makes it easy to manufacture the photonic crystal.

Embodiment 3

Figure 10:
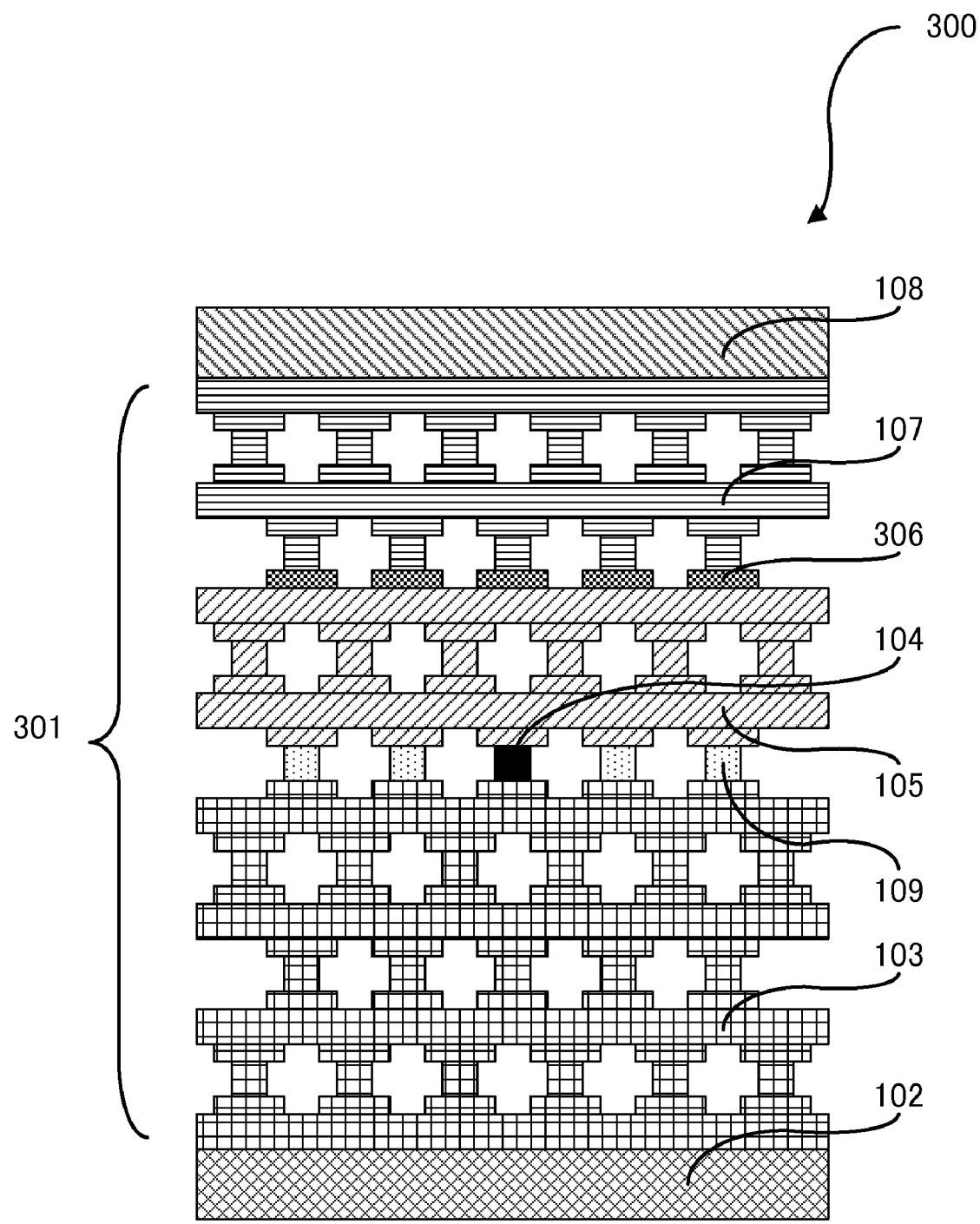
FIG. 10 is a cross-sectional view showing the configuration of a three-dimensional photonic crystal light emitting device that is a third embodiment (Embodiment 3) of the present invention.

FIG. 10 shows a cross section of a three-dimensional photonic crystal that is Embodiment 3 of the present invention. Component parts which are the same as those in FIG. 1 are denoted by the same reference numerals in FIG. 1 (however, the three-dimensional photonic crystal is denoted by reference numeral 301).

A light emitting device 300 in the present embodiment employs a configuration (structure) of the three-dimensional photonic crystal 301 having a discrete structure as disclosed in Japanese Patent Laid-Open No. 2005-292787, and arranges a tunnel junction layer 306 as a discrete structure layer (additional layer) in the three-dimensional photonic crystal 301.

Figure 11:
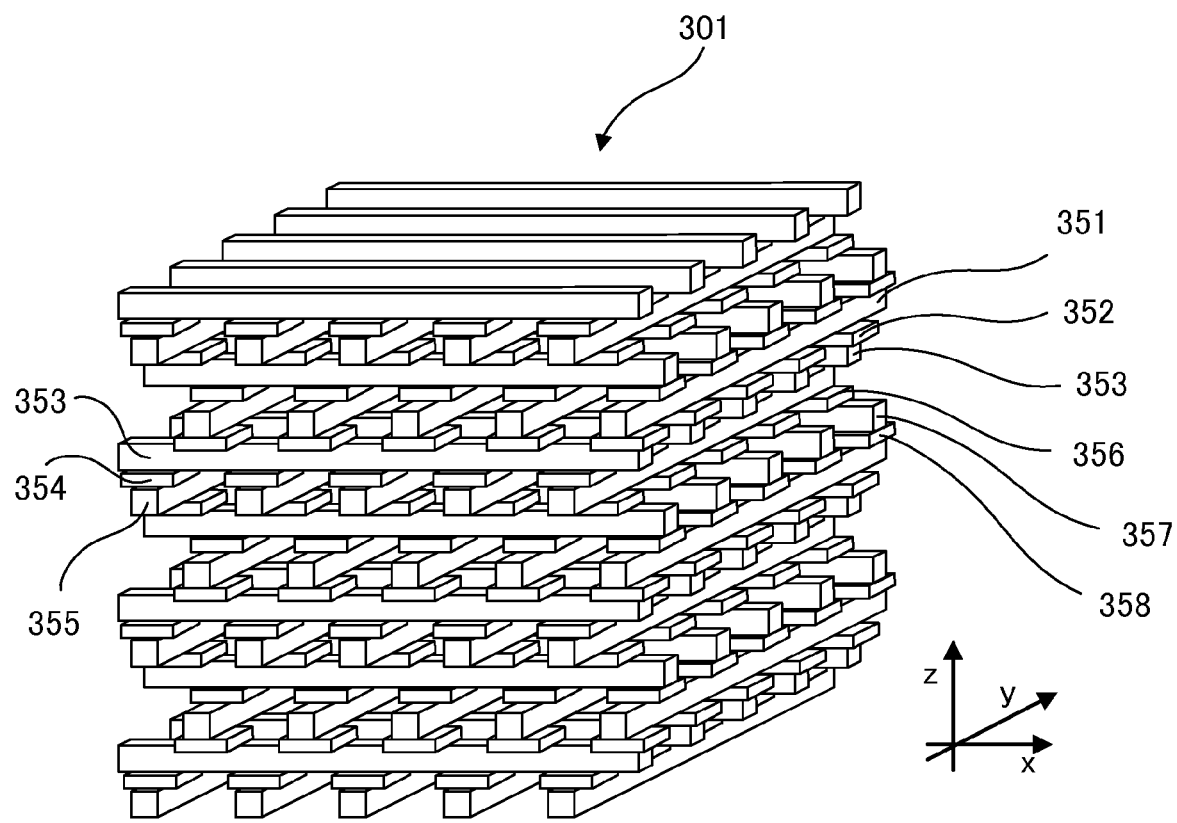
FIG. 11 is a cross-sectional view showing the configuration of the three-dimensional photonic crystal light emitting device of Embodiment 3 and Japanese Patent Laid-Open No. 2005-292787.

FIG. 11 sterically shows the configuration of the three-dimensional photonic crystal in the present embodiment and Japanese Patent Laid-Open No. 2005-292787. The three-dimensional photonic crystal 301 has a first layer and a third layer in which columnar structures (first structures) 351 and 355 extending in a y-direction (first direction) are periodically arranged in an x-direction (second direction) orthogonal to the y-direction with gaps. Further, the three-dimensional photonic crystal 301 has a second layer and a fourth layer in which columnar structures (second structures) 353 and 357 extending in the x-direction are periodically arranged in the y-direction with gaps. The first layer to the fourth layer are stacked in a z-direction in order from the first layer to the fourth layer so as to include therebetween additional layers in which structures (third structures: also referred to as discrete structures) 352, 354, 356 and 358 having a shape such as a flat plate shape are discretely arranged in planes parallel to the respective layers. In the additional layer, the discrete structures may form one layer or plural layers.

Moreover, the columnar structures 351 included in the first layer and the columnar structures 355 included in the third layer are arranged so as to shift from each other by a half pitch in the x-direction. Further, the columnar structures 353 included in the second layer and the columnar structures 357 included in the fourth layer are arranged so as to shift from each other by a half pitch in the y-direction.

The discrete structures 352, 354, 356 and 358 are arranged at positions where the columnar structures 351 and 355 sterically intersect with the columnar structures 353 and 357. The positions can be said as positions corresponding to intersections of the columnar structures 351, 355, 353 and 357

In the light emitting device 300 of the present embodiment, a laser oscillation wavelength is approximately 500 nm, and the semiconductor forming the cladding layers is GaN with a refractive index of 2.4. At this time, a thickness of the tunnel junction layer is preferably 100 nm or less, and more preferably, approximately 20 nm. Since a thickness of the discrete structures 352, 354, 356 and 358 in the photonic crystal 301 is approximately 20 nm, carrier conduction is effectively performed in a case in which the discrete structures (additional layers) are made to be a tunnel junction layer.

The discrete structures in the tunnel junction layer may have a same shape and a same cross-sectional area as those of the discrete structures other than the discrete structures in the tunnel junction layer. Further, in order to lower a contact resistance, the cross-sectional area of the discrete structure in the tunnel junction layer may be made larger than that of the discrete structure other than the discrete structure in the tunnel junction layer.

Figure 12:
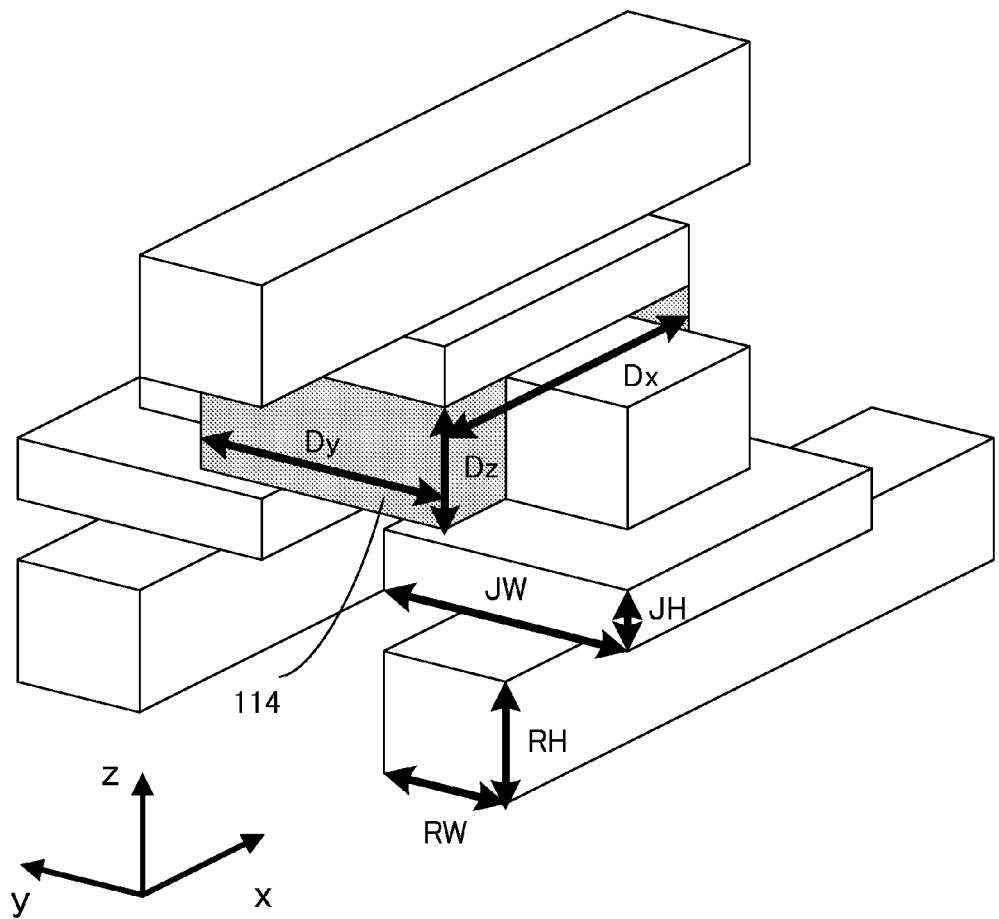
FIG. 12 is an enlarged view showing the vicinity of a point defect resonator in the three-dimensional photonic crystal light emitting device of Embodiment 3 and Japanese Patent Laid-Open No. 2005-292787

FIG. 12 shows an enlarged view of the vicinity of the point defect resonator in the three-dimensional photonic crystal in the present embodiment and Japanese Patent Laid-Open No. 2005-292787. FIG. 12 takes an x-axis and a y-axis in directions parallel to the respective layers (in-plane directions of the respective layers), and takes a z-axis in a stacking direction of the layers.

When a lattice constant is defined as a, a width RW of the columnar structure is 0.32 a, and a height RH thereof is 0.24 a. Further, a width JW of the discrete structure is 0.54 a, and a height JH thereof is 0.10 a. The point defect resonator 114 has a rectangular shape as shown in FIG. 12, and its lengths Dx, Dy and Dz in the directions of the x-axis, y-axis, and z-axis are respectively 1.20 a, 1.20 a and 0.24 a.

Figures 13, 14:
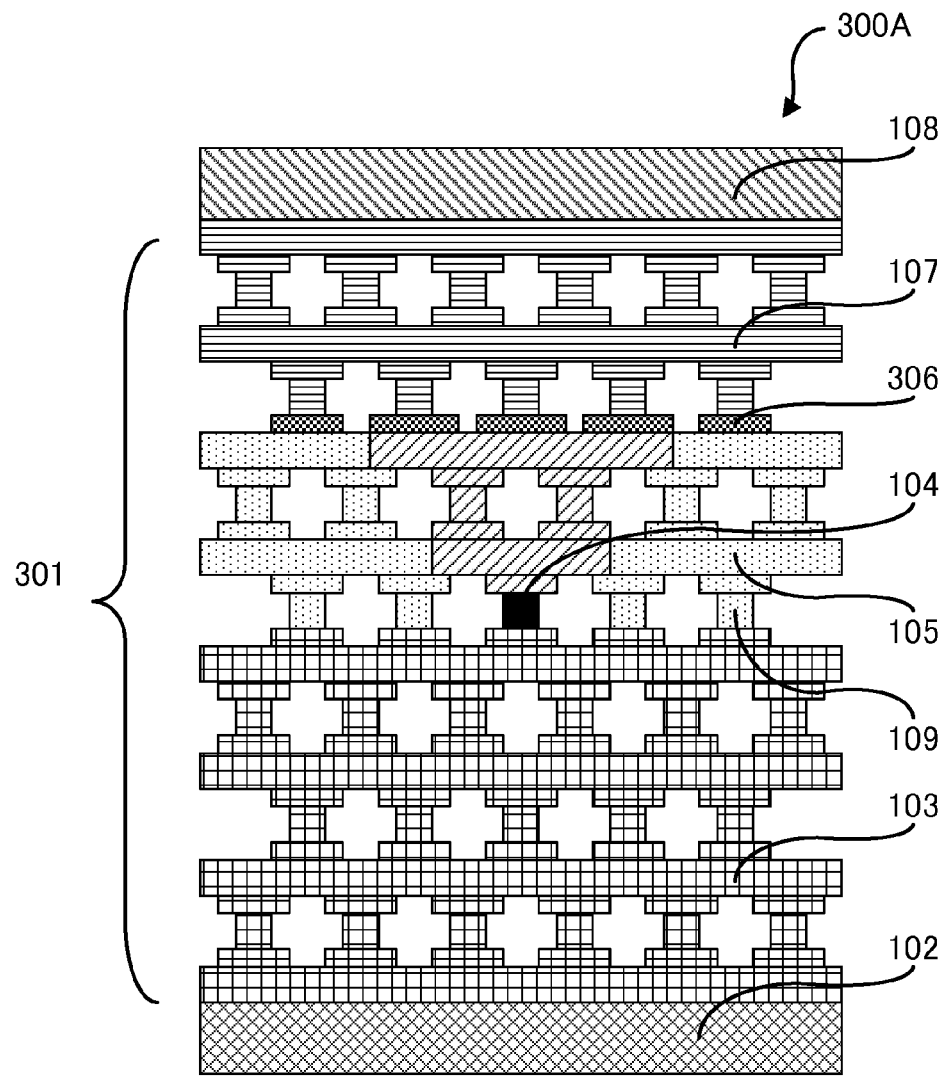
FIG. 13 is a table showing examples of the shape and Q-factor of a discrete structure in Embodiment 3.
FIG. 14 is a cross-sectional view showing the configuration of a three-dimensional photonic crystal light emitting device that is a modified example of Embodiment 3.

FIG. 13 shows Q-factor when the shape of the discrete structure in the tunnel junction layer is changed from the above-described shape. The period in the x-y plane is 13×13, and a periodic number in the z-direction is 7 periods.

The tunnel junction layer is formed as a discrete structure layer which is in a layer separated by 7 layers counted from the layer including the point defect, as shown in FIG. 10. Since the discrete structure is lower in height in the stacking direction than the columnar structures, even if the cross-sectional area of the discrete structure is made wider as shown in FIG. 13, the level of the optical confinement effect does not change. Accordingly, the carrier injection efficiency can be improved while keeping a favorable optical confinement effect.

As described in Embodiment 1 as well, since the P-cladding layer 105 preferably has one period or less, the tunnel junction layer is preferably provided in a discrete structure layer within one period counted from the layer including the point defect. Since one period of the photonic crystal 301 includes 8 layers, the shape of the discrete structure in the layer separated by 7 layers counted from the layer including the point defect is changed in this embodiment.

In the present embodiment, the shapes of all the discrete structures in the tunnel junction layer are uniformly changed. However, in a case in which a current confining region is provided in a part of the P-cladding layer, it suffices to widen only the cross-sectional areas of the discrete structures of the portion contacting the P-type semiconductor.

Embodiment 4

Next, description will be made of a method for manufacturing the three-dimensional photonic crystal light emitting device which has been described in the respective embodiments. Hereinafter, the method for manufacturing the three-dimensional photonic crystal light emitting device of Embodiment 1 as an example will be described with reference to FIG. 15.

Figure 15A:
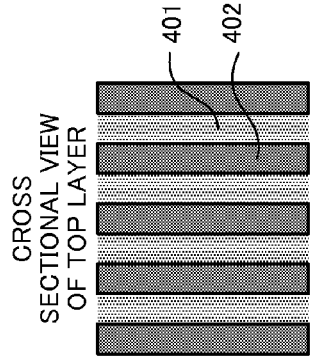
FIG. 15 is views showing a method for manufacturing the three-dimensional photonic crystal light emitting device, which is described as a fourth embodiment (Embodiment 4) of the present invention.

First, as shown in FIG. 15A, a periodic structure 401 of a semiconductor is produced by photolithography or the like.

Figure 15B:
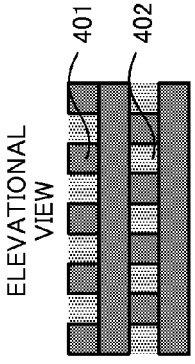

Next, as shown in FIG. 15B, portions (spaces) other than the periodic structure 401 are filled with a sacrificial layer 402. Then, the periodic structure 401 and the sacrificial layer 402 are planarized by a chemical mechanical polish method or the like.

Figure 15C:
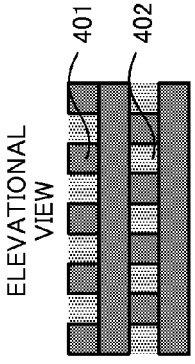
Figure 15D:
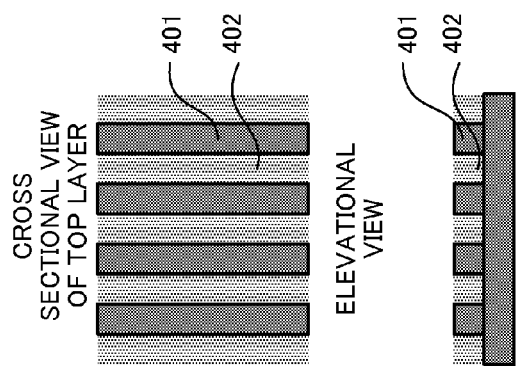

Further, as shown in FIGS. 15C to 15D, the processes shown in FIGS. 15A and 15B are repeated onto the periodic structure 401 whose spaces has been filled with the sacrificial layer 402 to form stacked layers. As the periodic structure 401, the P-cladding layer 105 is formed of a P-type semiconductor, the N-cladding layer 103 is formed of an N-type semiconductor, the N-conductive layer 107 is formed of a transparent conductive material, and the tunnel junction layer 106 is formed of a P-type semiconductor and a transparent conductive material.

For example, Mg-doped GaN formed as a film by CVD is used as the P-type semiconductor, and Si-doped GaN formed as a film by CVD is used as the N-type semiconductor. Further, Nb-doped $TiO_2$ formed as a film by sputtering is used as the transparent conductive material.

Figure 15E:
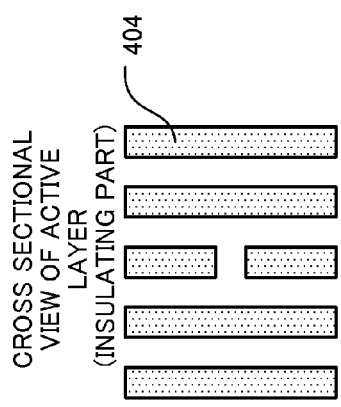
Figure 15F:
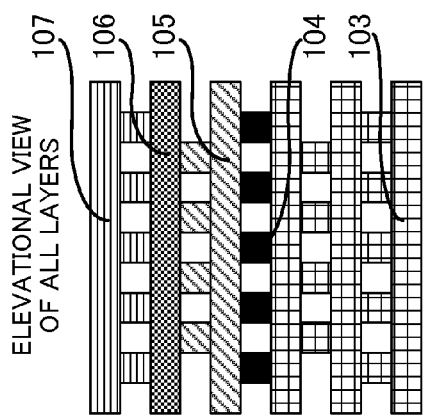

In a case where an insulating part 404 is formed on a portion other than an active layer 403 in a layer including a defect resonator, as shown in FIG. 15E, a pattern other than the active layer 403 is formed by the insulating part 404 once, and then as shown FIG. 15E, the active layer 403 is formed by electron beam induced chemical vapor deposition or the like. Further, when a current confining region is formed in the P-cladding layer, the current confining region is formed by using selective annealing or selective ion implantation.

The present embodiment described the method for manufacturing the three-dimensional photonic crystal formed such that the respective layers are sequentially stacked. However, the three-dimensional photonic crystal may be manufactured by bonding respective layers separately produced.

As described above, each of the embodiments can realize a three-dimensional photonic crystal light emitting device having both high carrier injection efficiency and a high optical confinement effect.

Furthermore, the present invention is not limited to these embodiments and various variations and modifications may be made without departing from the scope of the present invention.

This application claims the benefit of Japanese Patent Application No. 2008-027872, filed on Feb. 7, 2008, which is hereby incorporated by reference herein in its entirety.

What is claimed is:

1. A three-dimensional photonic crystal light emitting device comprising:

a three-dimensional photonic crystal; and a defect forming a resonator in the three-dimensional photonic crystal, wherein, in the three-dimensional photonic crystal, an N-cladding layer formed of an N-type semiconductor, an active layer disposed inside the resonator, a P-cladding layer formed of a P-type semiconductor, a tunnel junction layer, and a first N-conductive layer formed of a first N-type conductor are arranged in this order, wherein electric conductivity of the first N-type conductor is higher than that of the P-type semiconductor, wherein the three-dimensional photonic crystal includes a second N-conductive layer formed of a second N-type conductor whose electric conductivity is higher than that of the N-type semiconductor on an opposite side of the active layer with respect to the N-cladding layer, wherein the three-dimensional photonic crystal is configured such that a first layer, a second layer, a third layer, and a fourth layer are stacked in this order, the first layer and the third layer respectively including first structures that extend in a first direction and are periodically arranged in a second direction orthogonal to the first direction with gaps, and the second layer and the fourth layer respectively including second structures that extend in the second direction and are periodically arranged in the first direction with gaps, wherein additional layers are arranged between the first to fourth layers, the additional layer including at least one layer in which third structures are discretely arranged in planes parallel to the first to fourth layers, wherein the first structures included in the first layer and the first structures included in the third layer are arranged so as to shift from each other by a half pitch in the second direction, and the second structures included in the second layer and the second structures included in the fourth layer are arranged so as to shift from each other by a half pitch in the first direction, and wherein each of the third structure is disposed at a position where the first structure sterically intersects with the second structure.

2. The three-dimensional photonic crystal light emitting device according to claim 1,
wherein a thickness of the P-cladding layer is smaller than that of the first N-conductive layer.

3. The three-dimensional photonic crystal light emitting device according to claim 1,
wherein the three-dimensional photonic crystal includes a dielectric layer on an opposite side of the tunnel junction layer with respect to the first N-conductive layer.

4. The three-dimensional photonic crystal light emitting device according to claim 1, wherein the first N-type semiconductor and the second N-type semiconductor are same materials.

5. The three-dimensional photonic crystal light emitting device according to claim 1,
wherein an electron affinity of the first N-type semiconductor is larger than that of the P-type semiconductor.

6. The three-dimensional photonic crystal light emitting device according to claim 1, wherein the tunnel junction layer is included in the additional layers.

7. The three-dimensional photonic crystal light emitting device according to claim 6,
wherein a cross-sectional area of the third structure in the tunnel junction layer is larger than that of the third structure in the additional layer other than the tunnel junction layer.

8. The three-dimensional photonic crystal light emitting device according to claim 1,
wherein the light emitting device is a laser device.

* * * * *